United States Patent
Gotou et al.

(10) Patent No.: US 9,562,728 B2
(45) Date of Patent: Feb. 7, 2017

(54) COOLING DEVICE WITH CORRUGATED FINS IN COMMUNICATION WITH SERPENTINE FLUID PASSAGEWAY

(75) Inventors: Naoya Gotou, Koga (JP); Hidenori Isago, Koga (JP); Yuuki Takahashi, Koga (JP)

(73) Assignee: SANOH INDUSTRIAL CO., LTD., Tokyo (JP)

(*) Notice: Subject to any disclaimer, the term of this patent is extended or adjusted under 35 U.S.C. 154(b) by 416 days.

(21) Appl. No.: 13/818,240

(22) PCT Filed: Jul. 1, 2011

(86) PCT No.: PCT/JP2011/065226
§ 371 (c)(1),
(2), (4) Date: Feb. 21, 2013

(87) PCT Pub. No.: WO2012/026217
PCT Pub. Date: Mar. 1, 2012

(65) Prior Publication Data
US 2013/0153186 A1 Jun. 20, 2013

(30) Foreign Application Priority Data
Aug. 23, 2010 (JP) .................... 2010-186552

(51) Int. Cl.
*F28F 7/00* (2006.01)
*F28F 3/02* (2006.01)
(Continued)

(52) U.S. Cl.
CPC ............ *F28F 3/025* (2013.01); *H01L 23/473* (2013.01); *H05K 7/20254* (2013.01); *H05K 7/20927* (2013.01); *H01L 2924/0002* (2013.01)

(58) Field of Classification Search
CPC ............ H05K 7/20254; H05K 7/20927; H01L 23/473; H01L 2924/00; H01L 2924/0002; F28F 3/025; F28F 3/12
(Continued)

(56) References Cited

U.S. PATENT DOCUMENTS 3,327,776 A * 6/1967 Butt ............................. 165/80.4
3,817,321 A * 6/1974 Von Cube et al. ...... 165/104.22
(Continued)

FOREIGN PATENT DOCUMENTS

CN 101167184 A 4/2008
CN 101273450 A 9/2008
(Continued)

OTHER PUBLICATIONS

International Search Report dated Sep. 27, 2011 for WO2012026217.
(Continued)

*Primary Examiner* — Len Tran
*Assistant Examiner* — Gordon Jones
(74) *Attorney, Agent, or Firm* — Marshall, Gerstein & Borun LLP

(57) ABSTRACT

A cooling device with which thicknesses of cover portions may be reduced. According to a first aspect of the present invention, the cooling device is equipped with a frame-shaped frame portion, cover portions, a supply port, a discharge port, and projection portions. The cover portions cover openings in the frame portion. The supply port is provided in the frame portion and supplies a cooling medium into the frame portion. The discharge port is provided in the frame portion and discharges the cooling medium in the frame portion to an exterior of the frame portion. The projection portions are projected from inner side faces of the frame portion and form a fluid channel (Continued)

along which the cooling medium flows in the frame portion. The cover portions are fixed to the projection portions.

7 Claims, 7 Drawing Sheets

(51) Int. Cl.
*H01L 23/473* (2006.01)
*H05K 7/20* (2006.01)

(58) Field of Classification Search
USPC .................. 165/80.4, 80.1, 70; 361/699
See application file for complete search history.

(56) References Cited

U.S. PATENT DOCUMENTS

| | | | |
|---|---|---|---|
| 4,801,778 A | 1/1989 | Mizutani et al. | |
| 4,871,015 A * | 10/1989 | Foley ............... | H01L 23/4006 165/76 |
| 5,662,163 A * | 9/1997 | Mira ................ | H01L 23/4006 165/185 |
| 6,457,514 B1 * | 10/2002 | Fumi ............... | H01L 23/473 165/170 |
| 7,173,823 B1 * | 2/2007 | Rinehart ........... | F28D 9/0031 165/80.4 |
| 8,102,652 B2 * | 1/2012 | Toh et al. ..................... | 361/699 |
| 8,339,785 B2 * | 12/2012 | Chang et al. ................. | 361/699 |
| 2006/0219388 A1 | 10/2006 | Terakado et al. | |
| 2009/0065178 A1 | 3/2009 | Kasezawa et al. | |
| 2009/0080159 A1 * | 3/2009 | Ippoushi ........... | H01L 23/473 361/701 |
| 2009/0086435 A1 | 4/2009 | Suzuki et al. | |
| 2009/0107655 A1 * | 4/2009 | Kajiura ............. | F28F 3/025 165/80.3 |
| 2010/0025126 A1 * | 2/2010 | Nakatsu et al. ............. | 180/65.1 |

FOREIGN PATENT DOCUMENTS

| | | |
|---|---|---|
| DE | 36 07 032 | 9/1986 |
| EP | 1710660 A2 | 10/2006 |
| EP | 2159838 A2 | 3/2010 |
| JP | 63293865 A | 11/1988 |
| JP | 3069245 | 7/1991 |
| JP | 742919 | 8/1995 |
| JP | 2004296748 A | 10/2004 |
| JP | 2006286767 A | 10/2006 |
| JP | 2006324647 A | 11/2006 |
| JP | 2010-021311 A | 1/2010 |

OTHER PUBLICATIONS

Written Opinion dated Sep. 27, 2011 for PCT/JP2011/065226.
International Preliminary Report of Patentability dated Aug. 9, 2012 for PCT/JP2011/065226.
Written Opinion of the IPEA dated May 15, 2012 for PCT/JP2011/065226.
Notification of First Office Action in CN Application No. 201180040399.0 dated Feb. 17, 2015, 12 pages.
Extended European Search Report in EP Application No. 11819688.0 dated Sep. 16, 2015, 7 pages.

* cited by examiner

COOLING DEVICE WITH CORRUGATED FINS IN COMMUNICATION WITH SERPENTINE FLUID PASSAGEWAY

TECHNICAL FIELD

The present invention relates to a cooling device.

BACKGROUND ART

As a cooling device (heat sink) that cools a heat-generating body, such as an insulated gate bipolar transistor (IGBT) component of an inverter for an electric vehicle or the like, a cooling device in which plural fins are provided in a box-shaped case and fluid channels are formed in the case is known (for example, Japanese Patent Application Laid-Open (JP-A) No. 2004-296748). In the cooling device disclosed in JP-A No. 2004-296748, the fins forming the fluid channels are provided protruding from an inner face of a top wall of the case. An IGBT component or the like is attached to the outer face of the top wall, and the cooling device is structured such that heat generated by the IGBT component or the like is transferred through the top wall of the case to the fins The fins are cooled (heat is exchanged) by a cooling medium such as water or the like flowing through the fluid channels.

When the cooling medium flows through the fluid channels, internal pressure in the case rises. Accordingly, the top wall of the case is commonly assured of a predetermined stiffness, by a plate thickness thereof being increased. However, when the plate thickness of the top wall of the case is made thicker, a heat transfer rate at which the heat from the IGBT component or the like is transferred to the fins falls. As a result, cooling efficiency of the IGBT component or the like falls.

SUMMARY OF INVENTION

Subject to be Addressed

A cooling device is proposed in which a thickness of a cover portion may be reduced.

Solution to Problem

A cooling device according to a first aspect of the present invention includes: a frame-shaped frame portion; a cover portion covering an opening in the frame portion; a supply port provided at the frame portion, the supply port supplying a cooling medium into the frame portion; a discharge port provided at the frame portion, the discharge port discharging the cooling medium in the frame portion to an exterior of the frame portion; and a projection portion that projects from an inner side face of the frame portion and forms a fluid channel along which the cooling medium flows in the frame portion, the cover portion being fixed to the projection portion.

According to the first aspect of the present invention, the stiffness of the cover portion is increased by the cover portion being fixed to the projection portion. Therefore, even when the cooling medium flows in the fluid channel and pressure acts on the cover portion, bulging in which the cover portion curves to the outer side in a protruding shape is suppressed. Because the cover portion is fixed to the projection portion and the stiffness of the cover portion is assured, a plate thickness of the cover portion may be reduced. That is, the cover portion may be made thinner. Thus, a heat transfer rate at which heat from a member to be cooled is transferred to the projection portion due to the cooled member being mounted at this cover portion is improved. As a result, cooling efficiency of the cooled member is improved.

In a cooling device according to a second aspect of the present invention, in the cooling device according to the first aspect, a fixing-receiving portion is provided at the projection portion, a fixing member that penetrates through the cover portion and fixes a cooled member to an outer face of the cover portion being retained at the fixing-receiving portion.

According to the second aspect of the present invention, the cooled member is fixed at the outer face of the cover portion by the fixing member that penetrates through the cover portion being retained at the fixing-receiving portion provided at the projection portion. Therefore, compared with, for example, a structure in which a fixing-receiving portion such as a female thread or the like is formed in a cover portion, fixing strength of the cooled member may be assured even though the thickness of the cover portion is reduced.

In a cooling device according to a third aspect of the present invention, in the cooling device according to the first aspect or the second aspect, a fin member that is disposed in the fluid channel is provided and is welded or brazed to the inner face of the cover portion.

According to the third aspect of the present invention, the fin member disposed in the fluid channel is welded or brazed to the inner face of the cover portion. Therefore, heat from the cooled member is transferred to the fin member via both the projection portion and the cover portion. The fin member is cooled by the cooling medium flowing through the fluid channel Moreover, the stiffness of the cover portion is increased by the fin member being welded or brazed to the inner face of the cover portion. Therefore, the plate thickness of the cover portion may be reduced further.

In a cooling device according to a fourth aspect of the present invention, in the cooling device according to any one of the first to third aspects, the cover portion is a cover body that closes the opening, the opening being open in a thickness direction of the frame portion.

According to the fourth aspect of the present invention, the cover portion is formed as the cover body that closes off the thickness direction opening of the frame portion. Thus, because the frame portion and the cover body are structured by separate bodies, the cover body may be formed with a reduced thickness by rolling forming, extrusion molding, press molding or the like. Therefore, machinability of the cover body is improved.

In a cooling device according to a fifth aspect of the present invention, in the cooling device according to the fourth aspect, the cover body is welded or brazed to the frame portion and the projection portion.

According to the fifth aspect of the present invention, because the cover body is welded or brazed to the frame portion and the projection portion, the stiffness of the cover body is increased. Therefore, the cover body may be reduced in thickness. Moreover, because the outer periphery portion of the cover body is welded or brazed to the frame portion, tightness (sealing) of the frame portion may be improved compared to a conventional structure (for example, JP-A No. 2004-296748) in which an O-ring is provided in a gap between a cover body and a frame portion and this cover body and frame portion are joined by bolts. Furthermore, because a sealing member such as an O-ring or the like is not required, costs may be reduced. Further still, as an example, a brazing filler is applied to the inner face of the cover body, and the cover body is brazed to the frame portion and the projection portion in a furnace. Thus, a number of assembly steps may be reduced.

In a cooling device according to a sixth aspect of the present invention, in the cooling device according to the fourth aspect or the fifth aspect, a gutter is formed at an edge of the opening of the frame portion, the cover body being placed in the gutter.

According to the sixth aspect of the present invention, because the cover body is placed in the gutter formed at the edge of the opening of the frame portion, compared with a structure in which a cover body is not placed in a gutter, the position of the cover body may be controlled.

In a cooling device according to a seventh aspect of the present invention, in the cooling device according to any one of the fourth to sixth aspects, a boss portion is provided at the projection portion, the boss portion being inserted into a penetrating hole formed in the cover portion and being joined to the penetrating hole.

According to the seventh aspect of the present invention, because the boss portion is inserted into and joined to the penetrating hole formed in the cover body, leakage of the cooling medium through the penetrating hole formed in the cover body is suppressed.

In a cooling device according to an eighth aspect of the present invention, in the cooling device according to any one of the first to third aspects, the cover portion is formed integrally with the frame portion so as to cover the opening at one thickness direction side of the frame portion.

According to the eighth aspect of the present invention, because the cover body that closes off the opening at the one thickness direction side of the frame portion is formed integrally with the frame portion, a number of steps in assembly of the frame portion and the cover body may be reduced.

In a cooling device according to a ninth aspect of the present invention, in the cooling device according to any one of the first to eighth aspects, a holding portion is provided at the projection portion, the fin member being held at the holding portion and the holding portion positioning the fin member with respect to the frame portion.

According to the ninth aspect of the present invention, because the fin member is held at the holding portion provided at the projection portion, the fin member is positioned with respect to the frame portion. Therefore, assembly of the frame portion and fin member is improved to be efficient.

In a cooling device according to a tenth aspect of the present invention, in the cooling device according to any one of the first to ninth aspects, the fin member is a corrugated plate, and an end portion of the corrugated plate is welded or brazed to the projection portion.

According to the tenth aspect of the present invention, because the end portion of the corrugated plate is welded or brazed to the projection portion, heat from the cooled member that is transferred to the projection portion is transferred to the fin member whose cooling efficiency is good. Therefore, cooling efficiency of the cooled member is improved.

Advantageous Effects of Invention

The present invention may provide a cooling device with which a thickness of a cover portion may be reduced.

BEST MODE FOR CARRYING OUT THE INVENTION

Figure 1:
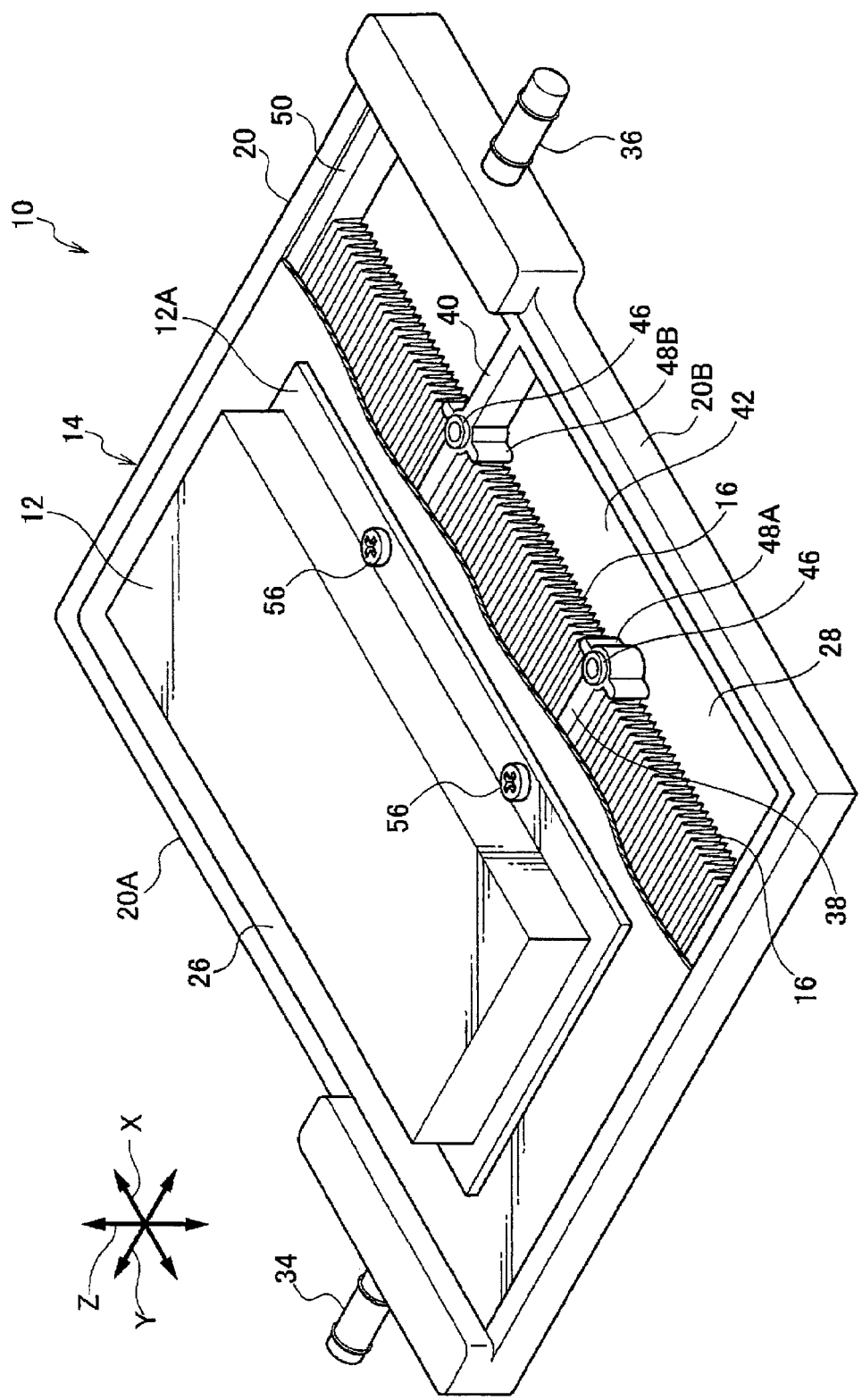
FIG. 1 is a perspective diagram showing a cooling device in accordance with an exemplary embodiment of the present invention.

Herebelow, a cooling device according to an exemplary embodiment of the present invention will be described while referring to the attached drawings. Arrows X, Y and Z that are shown where appropriate in the drawings indicate, respectively, a width direction, a depth direction and a thickness direction of the cooling device according to the present exemplary embodiment. The descriptions below are given with the direction of arrow Z being the vertical direction.

FIG. 1 to FIG. 4 show a cooling device 10 according to the present exemplary embodiment. Cooled members 12 such as, for example, semiconductor components used in an inverter for a hybrid car or electric car or the like are mounted to the cooling device 10. The cooling device 10 cools the cooled members 12 by transferring heat of the cooled members 12 to a cooling medium flowing inside the cooling device 10.

Specifically, the cooling device 10 is equipped with a case 14 and fin members 16 that are accommodated in the case 14. The case 14 is equipped with a frame-shaped frame body 20, which serves as a frame portion, and two covers 26 and 28, which serve as cover portions. The covers 26 and 28 cover openings 22 and 24 (see FIG. 4) in the thickness direction of the frame member 20 (the direction of arrow Z).

Figure 2:
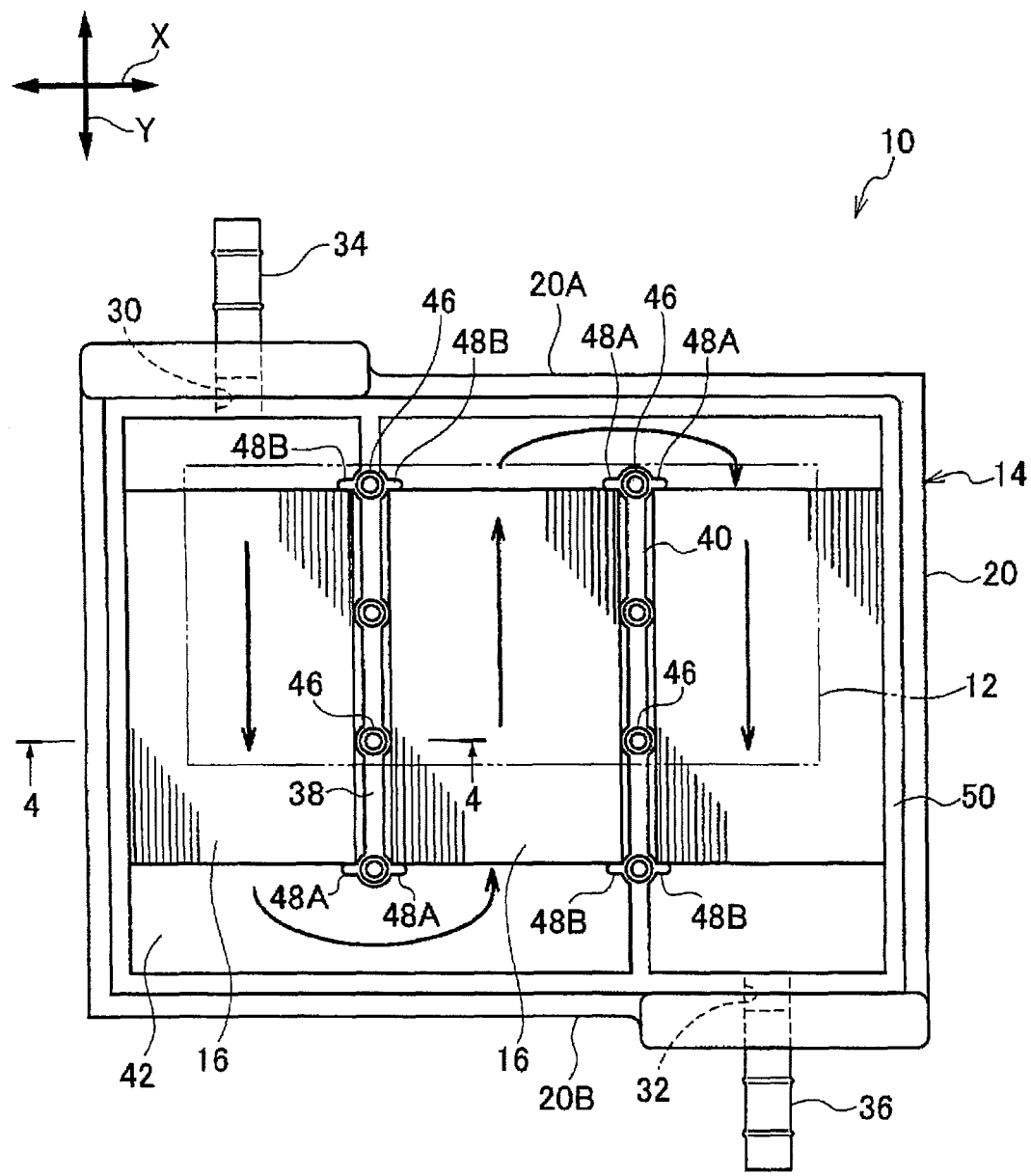
FIG. 2 is a plan diagram showing a state in which fin members are disposed in a frame-shaped body in accordance with the exemplary embodiment of the present invention.
Figure 3:
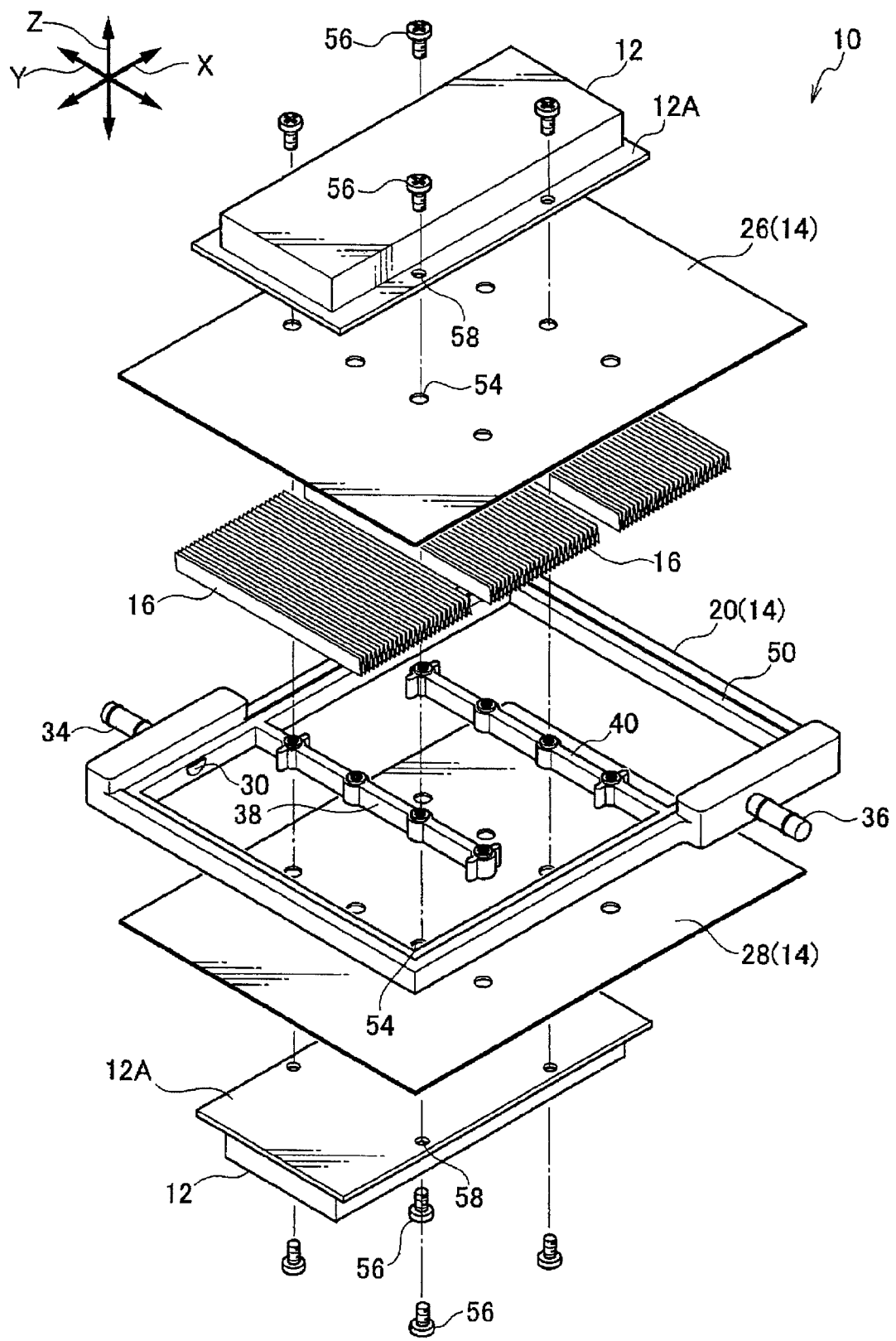
FIG. 3 is an exploded perspective diagram showing the cooling device in accordance with the exemplary embodiment of the present invention.

As shown in FIG. 2, the frame body 20 is made of metal (for example, aluminium, copper or the like) and is formed by casting (die-casting) or the like. A supply port 30 and a discharge port 32 are respectively formed in either of side walls 20A or 20B, in the depth direction of the frame body 20. A cooling medium such as cooling water, oil or the like is supplied through the supply port 30 into the frame body 20, and the cooling medium in the frame body 20 is discharged outside the frame body 20 through the discharge port 32. The supply port 30 and discharge port 32 are provided at opposite corners of the frame body 20. Connecting pipes 34 and 36 are fitted into the supply port 30 and the discharge port 32, respectively. The connecting pipe 34 is connected to a pump via a hose or the like, which is not shown in the drawings, such that the cooling medium is supplied to the interior of the frame body 20 through the supply port 30.

Projection portions 38 and 40 are respectively formed from either one of inner faces (inner side faces) of the side walls 20A or 20B, in the depth direction of the frame body 20 (the direction of arrow Y). The projection portions 38 and 40 are formed integrally with the frame body 20 by casting or the like. The projection portion 38 projects from the inner face of one side wall 20A toward the other side wall 20B, and the projection portion 40 protrudes from the inner face of the other side wall 20B toward the one side wall 20A. The projection portions 38 and 40 are spaced apart in the width direction of the frame body 20 (the direction of arrow X). The interior of the frame body 20 is divided up into an "S" shape in plan view by the projection portions 38 and 40. Thus, a fluid channel 42 that guides the cooling medium supplied through the supply port 30 to the discharge port 32 is formed in the interior of the frame body 20. Arrows in FIG. 2 show the flow of the cooling medium (the direction of circulation).

Figure 4:
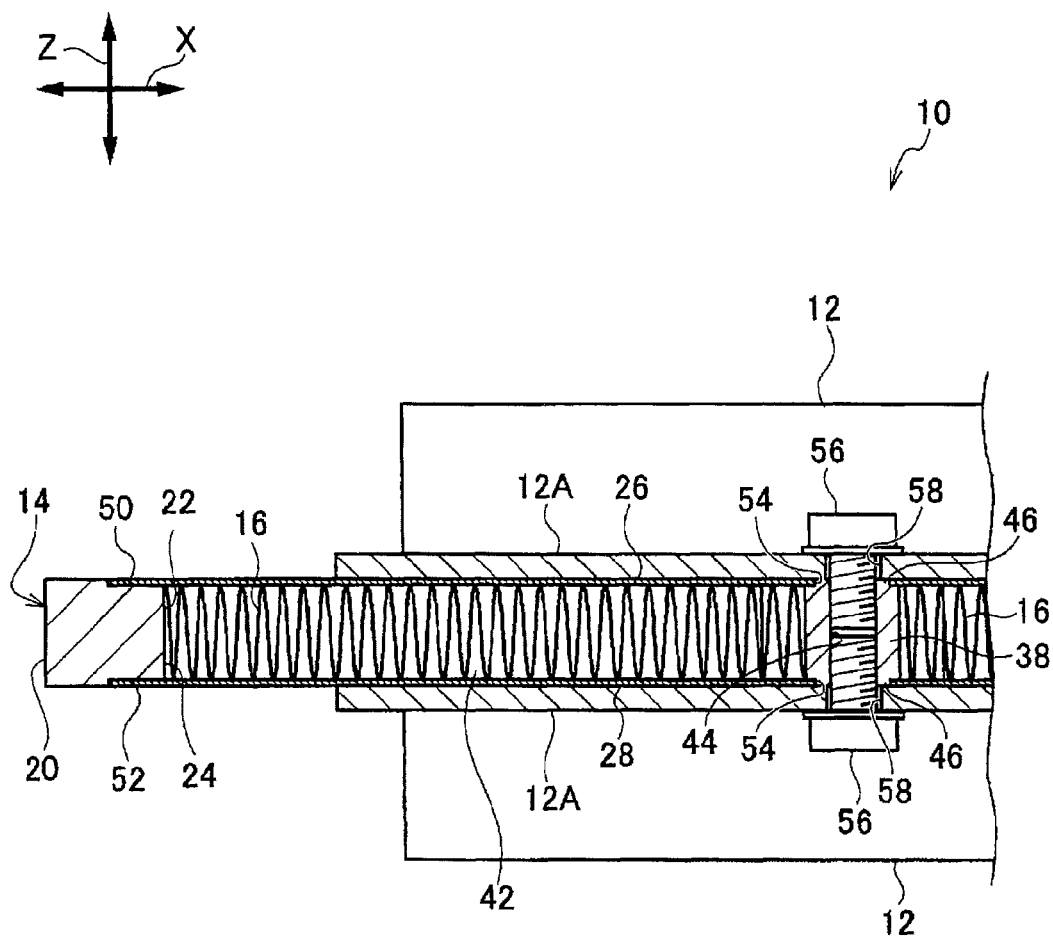
FIG. 4 is an enlarged sectional diagram cut along line 4-4 of FIG. 2.

Plural numbers (fours in the present exemplary embodiment) of threaded holes 44 that serve as fixing-receiving portions are formed in the projection portions 38 and 40 (see FIG. 4). The threaded holes 44 are spaced apart in the direction of projection (longitudinal direction) of the projection portions 38 and 40. Bolts (fixing members) 56, which are described below, may be fastened to the threaded holes 44. Boss portions 46 are provided at the edges of the threaded holes 44. The boss portions 46 have tubular shapes, stand from the edges of the threaded holes 44, and can be fitted into penetrating holes 54 that are formed in the covers 26 and 28, which are described below. Steps (step portions) are formed between the boss portions 46 and the projection portions 38 and 40.

Holding portions 48A and 48B are provided at distal end sides and proximal end sides of the projection portions 38 and 40. The fin members 16 are held at the holding portions 48A and 48B. The holding portions 48A and 48B are protrusions that protrude in the width direction of the frame body 20 from side walls of the projection portions 38 and 40. The fin members 16 are disposed between the distal end side holding portions 48A and the proximal end side holding portions 48B of the projection portions 38 and 40. Due to the fin members 16 being sandwiched by the holding portions 48A and 48B, the fin members 16 are positioned with respect to the frame body 20, and displacement of the fin members 16 in the circulation direction of the cooling medium (the direction of arrow Y) is restricted.

The fin members 16 are corrugated plates, which are metal plates of aluminium, copper or the like with good thermal conductivity, that have been processed to be bent into wave shapes. The fin members 16 are arranged in the fluid channel 42 with fold portions oriented in the circulation direction of the cooling medium (the direction of arrow Y). Thus, the interior of the fluid channel 42 is divided (partitioned) by the fold plates (fins) of the fin members 16, in a direction orthogonal to the circulation direction of the cooling medium (in the direction of arrow X), into plural compartments (fluid channels), and a surface area of the fin members 16 in contact with the cooling medium is made large.

The meaning of the phrase "the interior of the fluid channel 42 is divided in a direction orthogonal to the circulation direction of the cooling medium" as used herein includes that the fold plates of the fin members 16 that extend in the circulation direction of the cooling medium configure dividing plates that divide up the interior of the fluid channel 42 and plural fluid channels through which the cooling medium flows are formed in the direction orthogonal to the circulation direction of the cooling medium between adjacent dividing plates.

As shown in FIG. 4, gutters 50 and 52 are formed all the way along peripheries of an upper face and a lower face of the frame body 20, at edges of the openings 22 and 24. Outer periphery portions of the covers 26 and 28 can be placed in (fitted in) the gutters 50 and 52. Bottom faces of the gutters 50 and 52 are coplanar with upper faces and lower faces of the projection portions 38 and 40. Thus, when the outer periphery portions of the covers 26 and 28 are fitted into the gutters 50 and 52, inner faces of the covers 26 and 28 come into contact with the upper faces and lower faces of the projection portions 38 and 40. In addition, heights (lengths in the direction of arrow Z) of the projection portions 38 and 40 are the same or substantially the same as heights (lengths in the direction of arrow Z) of the fin members 16. Thus, when the inner faces of the covers 26 and 28 are in contact with the upper faces and lower faces of the projection portions 38 and 40, the inner faces of the covers 26 and 28 are also in contact with folded portions of the fin members 16. The gutters 50 and 52 are omitted from the drawings where appropriate.

The covers 26 and 28 are each constituted of a clad material, in which the inner face of a metal plate of aluminium, copper or the like that has good thermal conductivity is coated with a brazing filler. The covers 26 and 28 are formed, with thin thicknesses, by rolling forming, extrusion molding, press molding or the like. The inner faces of the covers 26 and 28 are each fixed to the gutters 50 and 52, projection portions 38 and 40 of the frame body 20, and the fin members 16 by brazing, and close off both of the openings 22 and 24 at the top and bottom of the frame body 20. Thus, the case 14 is sealed closed, and an airtight chamber is formed inside the case 14. The covers 26 and 28 are joined to the frame body 20 by the projection portions 38 and 40, and the opposing covers 26 and 28 are joined to one another by the projection portions 38 and 40 and the fin members 16. Therefore, stiffness of the covers 26 and 28 with respect to bending and the like is large.

Rather than a clad material, the covers 26 and 28 may be constituted by aluminium plates or the like, and a brazing filler and flux may be applied to the inner faces of the covers 26 and 28 before brazing of the covers 26 and 28.

Plural numbers of the penetrating holes 54 are formed in each of the covers 26 and 28. When the outer periphery portions of the covers 26 and 28 are fitted into the gutters 50 and 52 of the frame body 20, the boss portions 46 provided at the projection portions 38 and 40 are fitted into the penetrating holes 54. Through the penetrating holes 54, the bolts 56 are fastened to the threaded holes 44. Thus, the cooled members 12 are fixed to each of the covers 26 and 28. Mounting holes 58, through which the bolts 56 penetrate, are formed in flange portions 12A of the cooled members 12. In FIG. 2, an outline of the cooled members 12 is shown by a two-dot chain line.

In a state in which the frame body 20, fin members 16, and covers 26 and 28 with these structures are provisionally assembled, the same are placed in a furnace, heated, and brazed to be integral. Specifically, the fin members 16 are disposed between the holding portions 48A and 48B provided at the projection portions 38 and 40 of the frame body 20. Thus, the fin members 16 are positioned with respect to the frame body 20. Then, the outer periphery portions of the covers 26 and 28 are fitted into the gutters 50 and 52 of the frame body 20 and the boss portions 46 provided at the projection portions 38 and 40 are fitted into the penetrating holes 54 formed in the covers 26 and 28. Thus, the openings 22 and 24 of the frame body 20 are closed. In this case, the connecting pipes 34 and 36 are preparatorily fitted into the supply port 30 and discharge port 32 of the frame body 20. Then, the provisionally assembled frame body 20, fin members 16 and covers 26 and 28 are heated in the furnace. Thus, the inner faces of the covers 26 and 28 are brazed to the gutters 50 and 52, the projection portions 38 and 40 of the frame body 20, and the fin members 16. At the same time, the edges of the penetrating holes 54 of the covers 26 and 28 are brazed to the upper faces and lower faces of the projection portions 38 and 40. Thus, the interior of the case 14 is sealed closed. Note that the connecting pipes 34 and 36 may be attached to the frame body 20 after the frame body 20, fin members 16, and covers 26 and 28 have been brazed to be integral.

Hence, the cooled members 12, such as IGBT components or the like, are mounted to the covers 26 and 28. Specifically, the bolts 56 are passed through the mounting holes 58 in the flange portions 12A of the cooled members 12 and the penetrating holes 54 in the covers 26 and 28, and are fastened to the threaded holes 44 formed in the projection portions 38 and 40 of the frame body 20. Thus, the flange portions 12A of the cooled members 12 are fixed to each of the covers 26 and 28 in a state of surface contact with the covers 26 and 28.

Next, operation of the cooling device according to the present exemplary embodiment is described.

When the pump, which is not shown in the drawings, is driven, the cooling medium is supplied to the interior of the case 14 through the supply port 30 into which the connecting pipe 34 is fitted. The cooling medium flows along the fluid channel 42 that is formed in the case 14 by the projection portions 38 and 40, and is discharged outside the case 14 through the discharge port 32 into which the connecting pipe 36 is fitted. Accordingly, heat is exchanged between the cooling medium and the projection portions 38 and 40, and the projection portions 38 and 40 are cooled. In addition, the fin members 16 are disposed in the fluid channel 42 and the cooling medium flows along the fold plates of the fin members 16. Accordingly, heat is exchanged between the cooling medium and the fin members 16, and the fin members 16 are cooled.

Meanwhile, heat from the cooled members 12 mounted to the covers 26 and 28 is transferred through the covers 26 and 28 to the projection portions 38 and 40 and fin members 16 brazed to the covers 26 and 28. Thus, heat from the cooled members 12 is taken up by the cooling medium, and the cooled members 12 are cooled. Because the interior of the fluid channel 42 is divided up, in the direction orthogonal to the circulation direction of the cooling medium, into plural compartments (fluid channels) by the fin members 16, the surface area of the fin members 16 in contact with the cooling medium is increased. Therefore, the cooling efficiency of the fin members 16 is improved and, as a result, the cooling efficiency of the cooled members 12 is improved.

Note that the projection portions 38 and 40 provided at the frame body 20 are brazed to the inner faces of the covers 26 and 28, and the fin members 16 are also brazed to the inner faces of the covers 26 and 28. Therefore, the stiffness of the covers 26 and 28 is increased, and bulging in which the covers 26 and 28 curve to their outer sides in protruding shapes is suppressed. Thus, because the projection portions 38 and 40 and fin members 16 contribute to the stiffness of the covers 26 and 28, the thicknesses of the covers 26 and 28 may be reduced. That is, the covers 26 and 28 may be made thinner. Consequently, a heat transfer rate at which the heat from the cooled members 12 is transferred to the projection portions 38 and 40 and the fin members 16 is improved and, as a result, the cooling efficiency of the cooled members 12 is improved. The fin members 16 are formed by bending of metal plates rather than casting.

Therefore, in comparison to a structure in which the fin members 16 and frame body 20 are integrally formed by casting or the like, spacings between adjacent fold plates (fins) may be made narrower and, consequently, the area in contact with the cooling medium may be made larger. Thus, the cooling efficiency of the fin members 16 is improved and, as a result, the cooling efficiency of the cooled members 12 is further improved.

In the present exemplary embodiment, the threaded holes 44 in which the bolts 56 that fix the cooled members 12 to the outer faces of the covers 26 and 28 are retained are formed in the projection portions 38 and 40. Therefore, in comparison to a structure in which the threaded holes 44 are formed in the covers 26 and 28, fixing strengths of the cooled members 12 may be assured even though the plate thicknesses of the covers 26 and 28 are reduced. Furthermore, the heat from the cooled members 12 is transferred to the projection portions 38 and 40 via the bolts 56. Therefore, the cooling efficiency of the cooled members 12 is improved. The edges of the penetrating holes 54 formed in the covers 26 and 28 are fixed by brazing to the upper faces and lower faces of the projection portions 38 and 40. Therefore, leakage of the cooling medium through the penetrating holes 54 is suppressed.

Because the outer periphery portions of the covers 26 and 28 are brazed to the gutters 50 and 52 of the frame body 20, tightness (sealing) of the case 14 is improved compared to a conventional structure (for example, JP-A No. 2004-296748) in which an O-ring would be provided in a gap between the outer periphery portions of the covers 26 and 28 and the frame body 20 and the outer periphery portions of the covers 26 and 28 would be joined to the frame body 20 by bolts. Furthermore, because a sealing member such as an O-ring or the like is not necessary, costs may be reduced. Because the frame body 20, fin members 16, and covers 26 and 28 are brazed to be integral in a furnace in the provisionally assembled-state, an O-ring assembly step and a bolt fixing step may be omitted. Therefore, the number of assembly steps is reduced and consequently productivity is improved. Because the holding portions 48A and 48B are provided at the projection portions 38 and 40, positioning of the fin members 16 with respect to the frame body 20 during provisional assembly is easy. Therefore, efficiency in assembly of the fin members 16 to the frame body 20 is improved.

In the present exemplary embodiment, the cooled members 12 may be mounted to each of the two covers 26 and 28. Therefore, compared to a structure such as a conventional structure (for example, JP-A No. 2004-296748) in which a cooled member is mounted only at one side of a cooling device, a mounting area for the cooled members 12 may be increased while the cooling device is reduced in size.

Because the covers 26 and 28 are placed in the gutters 50 and 52 formed at the edges of the openings 22 and 24, respectively, at the top and bottom of the frame body 20, the positions of the covers 26 and 28 may be controlled compared to a structure in which the covers 26 and 28 are not placed in the gutters 50 and 52. In addition, a device thickness (length in the direction of arrow Z) of the cooling device 10 may be reduced.

Because the boss portions 46 are fitted into the penetrating holes 54 formed in the covers 26 and 28, melted brazing filler flows into gaps between the boss portions 46 and the inner periphery walls of the penetrating holes 54, and fills in these gaps. Therefore, the outer periphery faces of the boss portions 46 are joined to the inner periphery faces of the penetrating holes 54. Consequently, leakage of the cooling medium through the penetrating holes 54 is suppressed. In addition, the ingression of brazing filler into the threaded holes 44 is suppressed by the boss portions 46.

Next, variant examples of the cooling device 10 according to the present exemplary embodiment are described.

In the exemplary embodiment described above, the two covers 26 and 28 are structured as separate bodies from the frame body 20. However, one of the two covers 26 and 28 may be formed to be integral with the frame body 20 (integrally formed). Specifically, as in a variant example illustrated in FIG. 5, a case 64 is formed in a box shape of which an upper portion is opened (the opening 22). The case 64 is provided with a frame-shaped frame portion 70, a cover portion 78 and the cover 26. The cover portion 78 closes an opening 74 at a lower portion of the frame portion 70. The cover 26 closes the opening 22 at the upper portion of the frame portion. The cover portion 78 is formed, in a thin plate shape, integrally with the frame portion 70 and the projection portions 38 and 40 by casting or the like, so as to close off the opening 74 at the lower portion of the frame portion 70, and constitutes a bottom wall of the case 64. The projection portions 38 and 40 project from inner side walls of the frame portion 70, and stand from an inner face of the cover portion 78. Thus, the cover portion 78 is fixed to the projection portions 38 and 40. The cover portion 78 and the frame portion 70 are linked by the projection portions 38 and 40. Penetrating holes 80 that communicate with the threaded holes 44 formed in the projection portions 38 and 40 are formed in the cover portion 78. Thus, the cooled members 12 may be mounted to the threaded holes 44 with the bolts 56.

In this case 64, it is sufficient that one plate thickness direction side be open (the opening 22) and the fin members 16 may be disposed thereinside. In this variant example, brazing filler is applied to a lower face of the fin members 16, and the inner face of the fin members 16 is brazed to the inner face of the cover portion 78 in the furnace.

Figure 5:
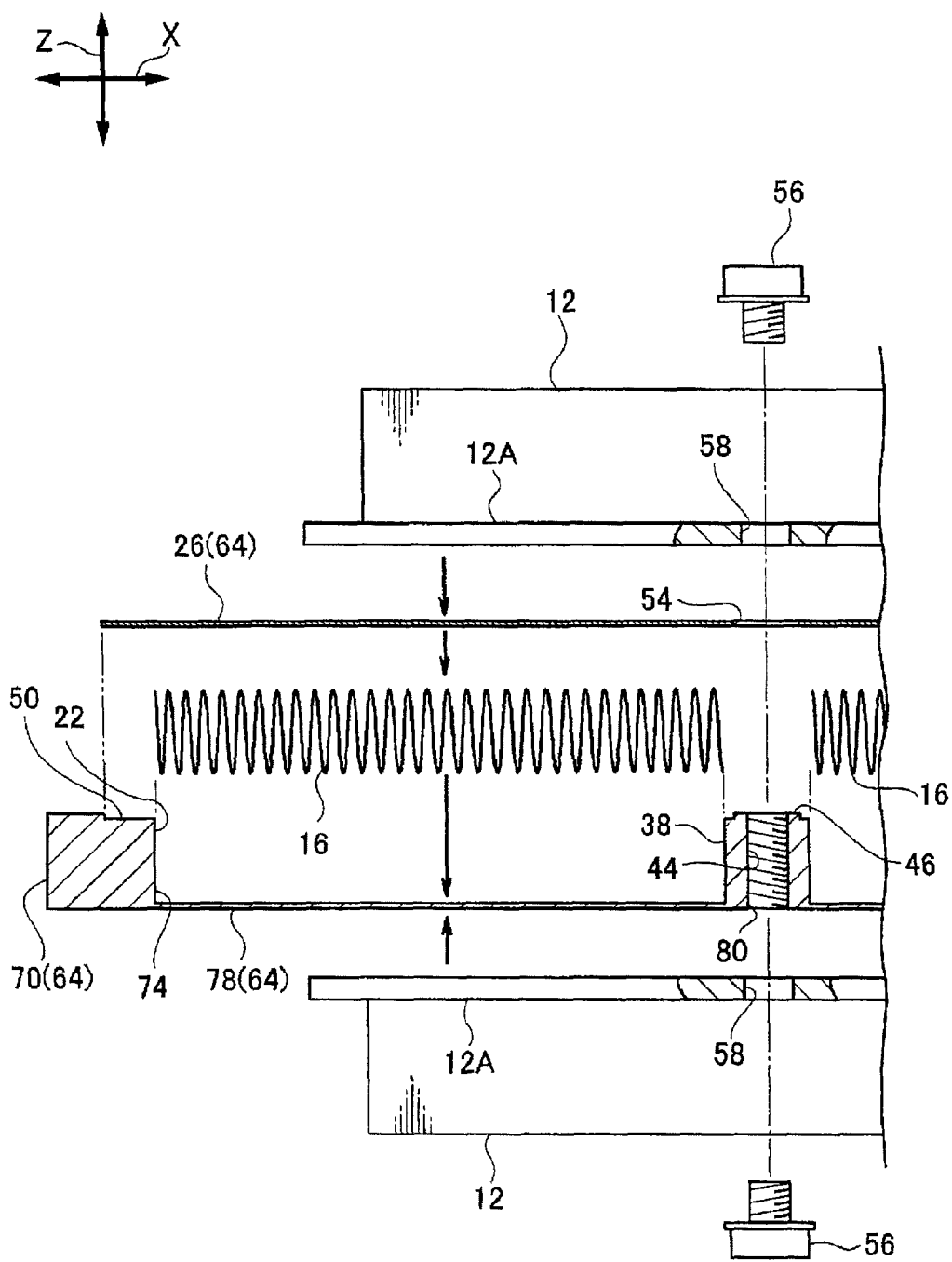
FIG. 5 is an exploded vertical sectional diagram showing a variant example of the cooling device in accordance with the exemplary embodiment of the present invention.
Figure 6:
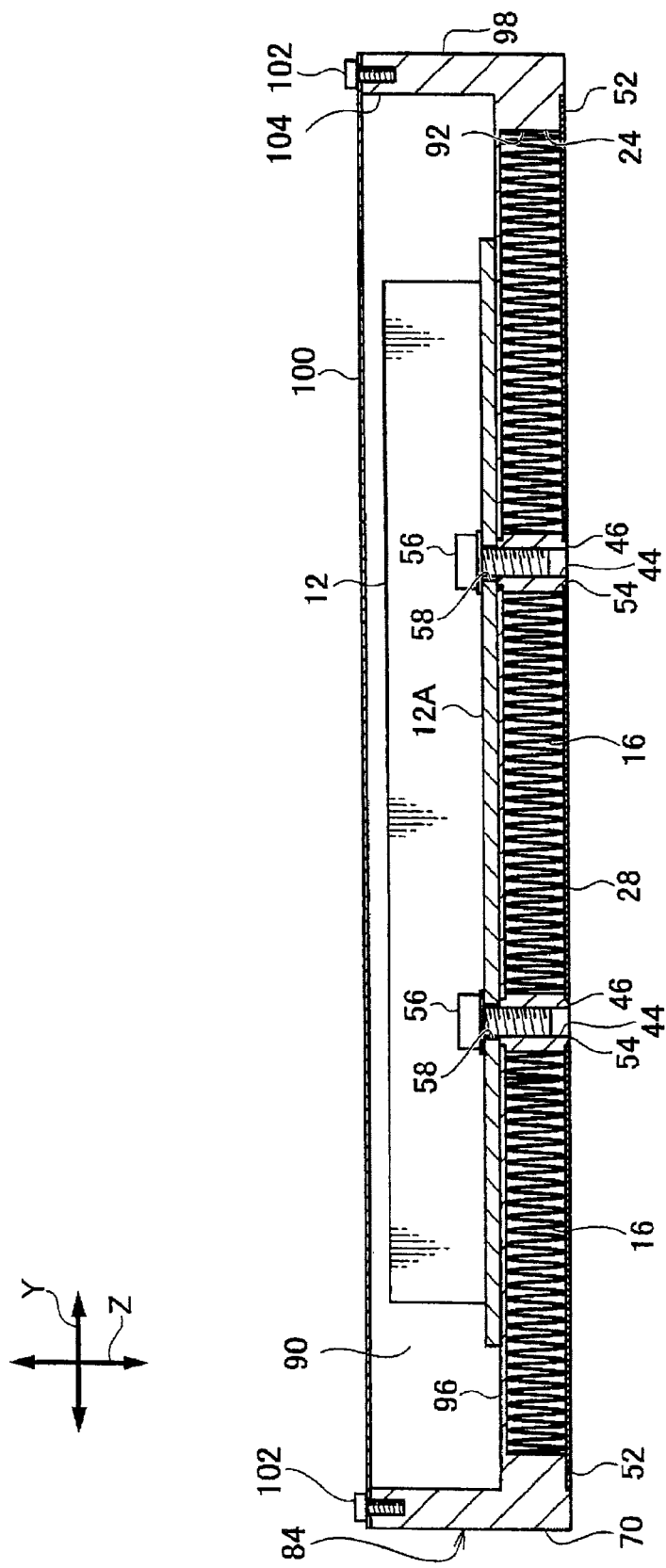
FIG. 6 is a vertical sectional diagram showing another variant example of the cooling device in accordance with the exemplary embodiment of the present invention.

An accommodation portion 90 that accommodates a cooled member 12 may be provided. Specifically, as in a variant example illustrated in FIG. 6, a case 84 is provided with the frame-shaped frame portion 70, a cover portion 96, the cover 28, and the accommodation portion 90. The cover portion 96 closes an opening 92 at the upper portion of the frame portion 70, the cover 28 closes the opening 24 at the lower portion of the frame portion 70, and the accommodation portion 90 is provided above the cover portion 96. The cover portion 96 is formed, in a thin plate shape, to be integral with the frame portion 70 and projection portions 38 and 40 by casting or the like (integrally formed), so as to close off the opening 92 at the upper portion of the frame portion 70. Thus, the cover portion 96 constitutes a top wall of the case 84. This case 84 is a structure in which the case 64 shown in FIG. 5 is vertically inverted and the accommodation portion 90 is added.

A side wall 98 stands from an outer periphery portion of the frame portion 70, and the accommodation portion 90 is formed inside the side wall 98. The cooled member 12 is disposed in the accommodation portion 90, and is fixed to the cover portion 96 with the bolts 56. A cover body 100 is fixed by screws 102 to an upper portion of the side wall 98. Thus, an opening 104 at the upper portion of the side wall 98 is closed off by this cover body 100. Hence, ingressions of water, dust and the like into the accommodation portion 90 are suppressed. Thus, the accommodation portion 90 may be provided integrally with the case 84.

Figure 7:
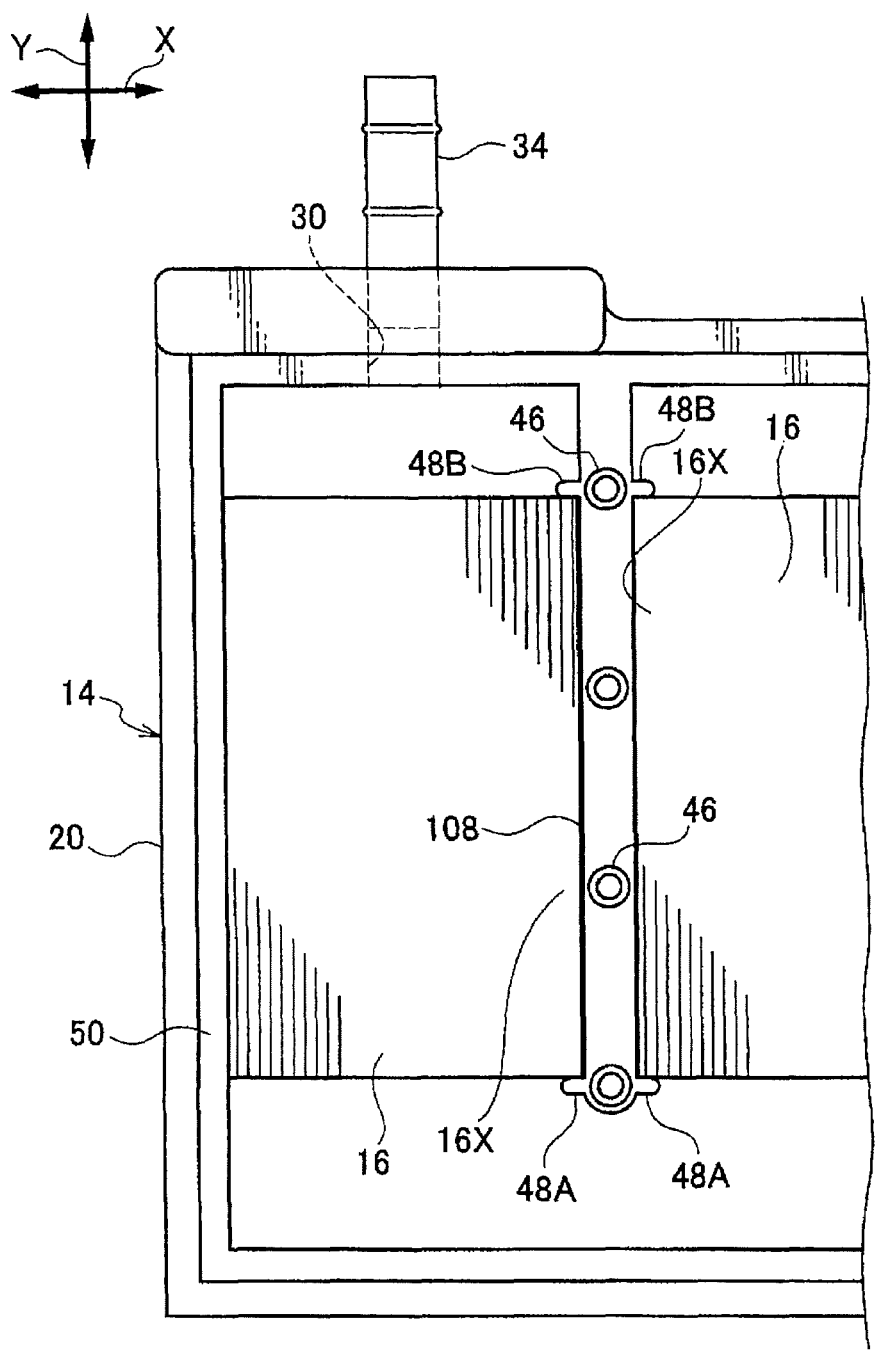
FIG. 7 is an enlarged plan diagram of principal portions, corresponding to FIG. 2, showing another variant example of the cooling device in accordance with the exemplary embodiment of the present invention.

As in a variant example illustrated in FIG. 7, side walls of a projection portion 108 may be formed to be flat, and end portions 16X of the fin members 16 may be caused to touch against the side walls of the projection portion 108 in the direction orthogonal to the circulation direction (the direction of arrow Y) of the cooling medium (i.e., in the direction of arrow X). That is, the end portions 16X of the fin members 16 that are adjacent to the projection portion 108 may be put into contact with the side walls of the projection portion 108. Thus, heat from the cooled members 12 that has been transferred to the projection portions 108 is transferred to the fin members 16 with good cooling efficiency. Thus, the cooling efficiency of the cooled members 12 is improved. The end portions 16X of the fin members 16 may be brazed to the side walls of the projection portion 108. Thus, a thermal transfer rate between the projection portions 108 and the fin members 16 is improved by the brazing filler being interposed between the end portions 16X of the fin members 16 and the projection portions 108. Consequently, the cooling efficiency of the cooled members 12 may be further improved.

In the exemplary embodiment described above, one of the cooled members 12 is fixed to each outer face of the covers 26 and 28. However, numbers, positions and the like of the cooled members 12 that are fixed to the covers 26 and 28 may be suitably modified. In such cases, the penetrating holes 54 and threaded holes 44 may be formed in the covers 26 and 28 and the projection portions 38 and 40, respectively, in accordance with the numbers and positions of the cooled members 12. Further, the cooled members 12 may be fixed to the covers 26 and 28 via heat diffusion members such as heat spreaders or the like. Note that the cooled members 12 are not limited to inverters and the like to be used in hybrid cars and the like; heat-generating bodies such as central processing units (CPUs) of computers and the like are applicable.

In the exemplary embodiment described above, the two projection portions 38 and 40 are provided at the inner side walls of the frame body 20. However, numbers, positions and the like of the projection portions 38 and 40 may be suitably modified. The holding portions 48A and 48B are provided at the distal end sides and proximal end sides of the projection portions 38 and 40, but this is not limiting. Positions at which the holding portions 48A and 48B are provided may be modified in accordance with shapes, positions and the like of the fin members 16, and the holding portions 48A and 48B may be omitted. While three of the fin members 16 are provided in the frame body 20, numbers, positions and the like of the fin members 16 may be suitably modified. Further, the shape of the frame body 20 is not limited to quadrilaterals; polygonal shapes such as pentagons and the like are also applicable, and circular shapes are applicable.

In the exemplary embodiment described above, the cooled members 12 are fixed to the outer faces of the covers 26 and 28 by the bolts 56 being retained at the threaded holes 44 formed in the projection portions 38 and 40, but this is not limiting. For example, the cooled members 12 may be fixed to the outer faces of the covers 26 and 28 by pawls provided at distal ends of pins that penetrate through the covers 26 and 28 being anchored at slot-form anchoring portions formed in the projection portions 38 and 40. It is sufficient that the boss portions 46 provided at the projection portions 38 and 40 be provided in accordance with necessity, and the boss portions 46 may be omitted as appropriate.

In the exemplary embodiment described above, the brazing filler is provided over the whole of the inner faces of the covers 26 and 28. However, the brazing filler may be applied only to portions of the covers 26 and 28 that are to be brazed. In the above exemplary embodiment, the frame body 20, fin members 16, and covers 26 and 28 are brazed to be integral in a furnace. However, laser brazing or the like may be used to braze the covers 26 and 28 to the frame body 20 and so forth, by the outer face sides of the covers 26 and 28 being illuminated with lasers and the brazing filler applied to the inner faces of the covers 26 and 28 being melted. Rather then using a brazing filler, welding that fuses and joins the covers 26 and 28 and the frame body 20 may be used. The outer periphery portions of the covers 26 and 28 are not limited to being brazed or welded to the frame body 20; the outer periphery portions of the covers 26 and 28 may be joined to the frame body 20 with bolts or the like, with a sealing member such as an O-ring or the like interposed.

The disclosures of Japanese Patent Application No. 2010-186552 are incorporated into the present specification by reference in their entirety.

All references, patent applications and technical specifications cited in the present specification are incorporated by reference into the present specification to the same extent as if the individual references, patent applications and technical specifications were specifically and individually recited as being incorporated by reference.

While an exemplary embodiment of the present invention has been described hereabove, the present invention is not to be limited to this embodiment. It will be obvious to those skilled in the art that the present invention can be embodied in numerous modes within a scope not departing from the spirit of the invention.

The invention claimed is:

1. A cooling device comprising:
a frame portion;
a supply port provided at the frame portion, the supply port supplying a cooling medium into the frame portion;
a discharge port provided at the frame portion, the discharge port discharging the cooling medium in the frame portion to an exterior of the frame portion;
a first projection portion that projects from an inner side face of the frame portion and forms a fluid channel along which the cooling medium flows in the frame portion from the supply port to the discharge port, the first projection portion including respective distal and proximal end sides;
two cover bodies that cover openings at both thickness direction sides of the frame portion, respective inner faces of the cover bodies being welded or brazed to the frame portion and the first projection portion;
fixing-receiving portions that are provided at the first projection portion, fixing members that penetrate through the two cover bodies and fix respective cooled members to outer faces of the two cover bodies being retained at the fixing-receiving portions;
a fin member that is disposed in the fluid channel; and
a distal holding portion extending perpendicularly from the distal end sides of the first projection portion and a proximal holding portion extending perpendicularly from the proximal end sides of the first projection portion, the fin member being held between the distal holding portion and the proximal holding portion, and the distal holding portion and the proximal holding portion positioning the fin member with respect to the frame portion,
wherein the first projection portion includes a side wall and portions of the side wall adjacent to each fixing-receiving portion protrude into the fluid channel, the fin member contacting the side wall adjacent to each fixing-receiving portion, and the fin member being spaced apart from the side wall at locations other than adjacent to each fixing-receiving portion.

2. The cooling device according to claim 1, wherein the fin member is welded or brazed to the inner faces of the two cover bodies.

3. The cooling device according to claim 1, wherein gutters are formed at edges of the openings of the frame portion, the cover bodies being placed in the gutters.

4. The cooling device according to claim 1, wherein boss portions are provided at the first projection portion, the boss portions being inserted into penetrating holes formed in the cover bodies and being joined to the penetrating holes.

5. The cooling device according to claim 2, wherein the fin member is a corrugated plate, and an end portion of the corrugated plate is welded or brazed to the first projection portion.

6. The cooling device according to claim 1, wherein a second projection portion projects from an inner face of the frame portion and the fin member is disposed between the first and second projection portions, thereby restricting the direction of fluid flow between the first and second projection portions, while fluid flow is unrestricted by the fin member around at least one end of each of the first and second projection portions.

7. The cooling device according to claim 1, further comprising:
a side wall stands from an outer periphery of the frame portion, extends along the thickness direction of the frame portion, and is integrally formed with the frame portion; and
a cover fixed to the side wall,
wherein an inside of the surrounding wall is adapted to accommodate a portion of a cooled member.

* * * * *